United States Patent
Cho et al.

(10) Patent No.: US 8,766,542 B2
(45) Date of Patent: Jul. 1, 2014

(54) FIELD-EMISSION ELECTRON GUN AND METHOD FOR CONTROLLING SAME

(75) Inventors: Boklae Cho, Hitachinaka (JP); Shigeru Kokubo, Mito (JP); Hisaya Murakoshi, Tokyo (JP); Hisao Nitta, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 54 days.

(21) Appl. No.: 13/577,998

(22) PCT Filed: Jan. 19, 2011

(86) PCT No.: PCT/JP2011/000233
§ 371 (c)(1),
(2), (4) Date: Sep. 26, 2012

(87) PCT Pub. No.: WO2011/102077
PCT Pub. Date: Aug. 25, 2011

(65) Prior Publication Data
US 2013/0200788 A1 Aug. 8, 2013

(30) Foreign Application Priority Data
Feb. 18, 2010 (JP) .................................. 2010-033048

(51) Int. Cl.
*H01J 7/24* (2006.01)

(52) U.S. Cl.
USPC .................. 315/111.81; 315/111.91; 315/108

(58) Field of Classification Search
USPC .................... 315/506, 507, 110, 108, 111.31, 315/111.61, 111.81, 111.91
See application file for complete search history.

(56) References Cited

U.S. PATENT DOCUMENTS 5,825,035 A * 10/1998 Mizumura et al. ........ 250/423 R
5,898,179 A    4/1999 Smick et al.
(Continued)

FOREIGN PATENT DOCUMENTS

EP    2148354       1/2010
JP    11-111205 A   4/1999
(Continued)

OTHER PUBLICATIONS

Cho et al., "Measurement of pressures in 10-10Pa range from the damping speed of field emission current", Applied Physics, 2007, vol. 91.

(Continued)

*Primary Examiner* — Douglas W Owens
*Assistant Examiner* — Jianzi Chen
(74) *Attorney, Agent, or Firm* — Mattingly & Malur, PC

(57) ABSTRACT

The disclosed charged particle beam apparatus includes a field-emission electron source including <310> single crystal of tungsten; a vacuum chamber having the electron source therein; an exhausting system for exhausting the vacuum chamber; a filament connected to the electron source to let flow a current through the electron source and thereby heat the electron source; a power supply for letting a current flow through the filament; an ammeter for measuring a total current emitted from the electron source; and a controlling unit for exercising control to cause the power supply to let a current flow through the filament when the total current measured periodically has become a predetermined ratio or less as compared with a total current from the electron source found immediately after first electron beam emission, or a total current from the electron beam found immediately after a current is let flow through the filament.

14 Claims, 13 Drawing Sheets

(56) References Cited

U.S. PATENT DOCUMENTS

| | | | |
|---|---|---|---|
| 7,853,364 B2 * | 12/2010 | Deakins et al. | 700/289 |
| 7,994,474 B2 * | 8/2011 | Hieke | 250/288 |
| 8,288,950 B2 * | 10/2012 | Walton et al. | 315/111.21 |
| 2005/0212440 A1 | 9/2005 | Fujieda et al. | |
| 2007/0158588 A1 | 7/2007 | Zhou et al. | |
| 2008/0169743 A1 | 7/2008 | Fujieda et al. | |
| 2008/0174225 A1 | 7/2008 | Tessner et al. | |
| 2008/0315122 A1 | 12/2008 | Katagiri et al. | |

FOREIGN PATENT DOCUMENTS

| | | |
|---|---|---|
| JP | 2007-073521 A | 3/2007 |
| JP | 2008-140623 A | 6/2008 |
| WO | 2009/153939 A1 | 12/2009 |

OTHER PUBLICATIONS

DE Office Action in DE App. No. 11 2011 100 597.0, dated Jan. 24, 2014.

* cited by examiner

FIELD ELECTRON EMISSION PATTERN OF W TIP

DECREASE CURVE OF EMISSION CURRENT Ip OF
<310> FIELD-EMISSION ELECTRON SOURCE

FIELD-EMISSION ELECTRON GUN AND METHOD FOR CONTROLLING SAME

TECHNICAL FIELD

The present invention relates to a field-emission electron gun and a method for controlling it, and in particular to an electron gun mounting a W<310> field-emission electron gun and a method for controlling it.

BACKGROUND ART

If a strong electric field is applied to a metal surface, a potential barrier has an inclination at a boundary to vacuum. If the electric field becomes at least $10^7$ V/cm, the barrier becomes superfine-pointed and electrons are emitted into the vacuum. This is called field emission. Dispersion of energy of emitted electrons becomes small and it is approximately 0.3 eV. An apex of a field-emission electron source is finished to have a radius of curvature of approximately 100 nm in order to generate a strong electric field.

Since the size of the spot diameter of the field-emission electron gun is as small as 5 to 10 nm, the field-emission electron gun has a feature that the brightness is extremely high and it is used often as an electron gun for high resolution SEMs and TEMs. Furthermore, since the energy width of emitted electrons is small, it is easy to obtain a high resolution even at a low acceleration voltage.

On the other hand, since it operates at the room temperature, the emission current is apt to become unstable due to gas adsorption. Ultra-high vacuum is needed. There is a possibility that the cathode surface will become rough due to shocks of residual gas molecules which are ionized by emitted electrons and the cathode will be destroyed finally. As described in Patent Literature 1, therefore, instantaneous heating of the cathode called flashing is conducted sometimes to remove adsorbed gas.

As the field-emission electron source, a needle (tip) of tungsten (W) is usually used. If flashing is conducted on the W electron source at a temperature of at least 1,500 K, the adsorbed layer is evaporated and a clean surface is obtained.

If the W surface is clean, electrons are emitted mainly from a (111) plane and a (310) plane which are relatively low in work function among all planes as indicated by a field emission pattern shown in FIG. 2. As the field-emission electrode source, therefore, a W<111> or a W<310> field-emission electron source having the (111) plane or the (310) plane disposed on the apex is used.

CITATION LIST

Patent Literature

Patent Literature 1: JP-A-2007-73521

Non Patent Literature

Non Patent Literature 1: B. Cho, Applied Physics Letters, Volume 91, (2007) P012105.

SUMMARY OF INVENTION

Technical Problem

The present inventor has found features in the way of decrease of the emission current from the W(310) plane. An object of the present invention is to disclose a method for using a field-emission electron source more stably by using this knowledge.

Solution to Problem

The present invention provides a charged particle beam apparatus including a field-emission electron source having <310> single crystal of tungsten, a vacuum chamber having the electron source disposed therein, an exhausting system for exhausting the vacuum chamber, a filament connected to the electron source and let flow a current to heat the electron source, a power supply for letting a current flow through the filament, an ammeter for measuring a total current emitted from the electron source, and a controlling unit for exercising control to cause the power supply to let a current flow through the filament when the total current measured periodically has become a predetermined ratio or less as compared with a total current from the electron source obtained immediately after first electron beam emission, or a total current from the electron source obtained immediately after a current is let flow through the filament.

Furthermore, the exhausting system keeps a pressure in the vacuum chamber at $10^{-9}$ Pa level or less.

Advantageous Effects of Invention

According to the present invention, it is possible to make the most of the original high brightness of the W<310> field-emission electron source effectively.

DESCRIPTION OF EMBODIMENTS

Prior to description of embodiments, a principle of the present invention will now be described.

If residual gas (for example, hydrogen) is adsorbed to a clean surface of a field-emission electron source, the work function increases and the emission current decreases. The decrease time τ is inversely proportional to pressure P, and τ·P is constant (Non Patent Literature 1). Therefore, the pressure change around the electron source can be known by measuring the change of the decrease time τ.

Figure 3:
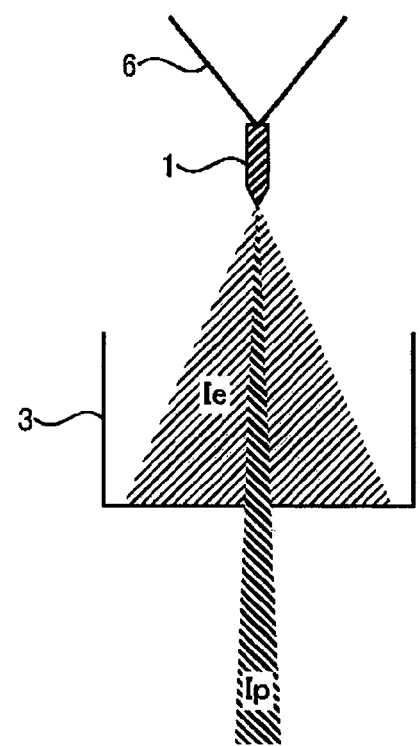
FIG. 3 is a diagram showing an example of an arrangement structure around an electron source used in the present invention.

In an electron microscope, only a very small part of a probe current (Ip) which gets out from a plane of a tip apex is used out of a total emission current (Ie) of an electron beam emitted from an electron source as shown in FIG. 3.

Hereafter, how the emission current decreases in an experiment in the case of the W<310> field-emission electron source will be described.

Figure 4:
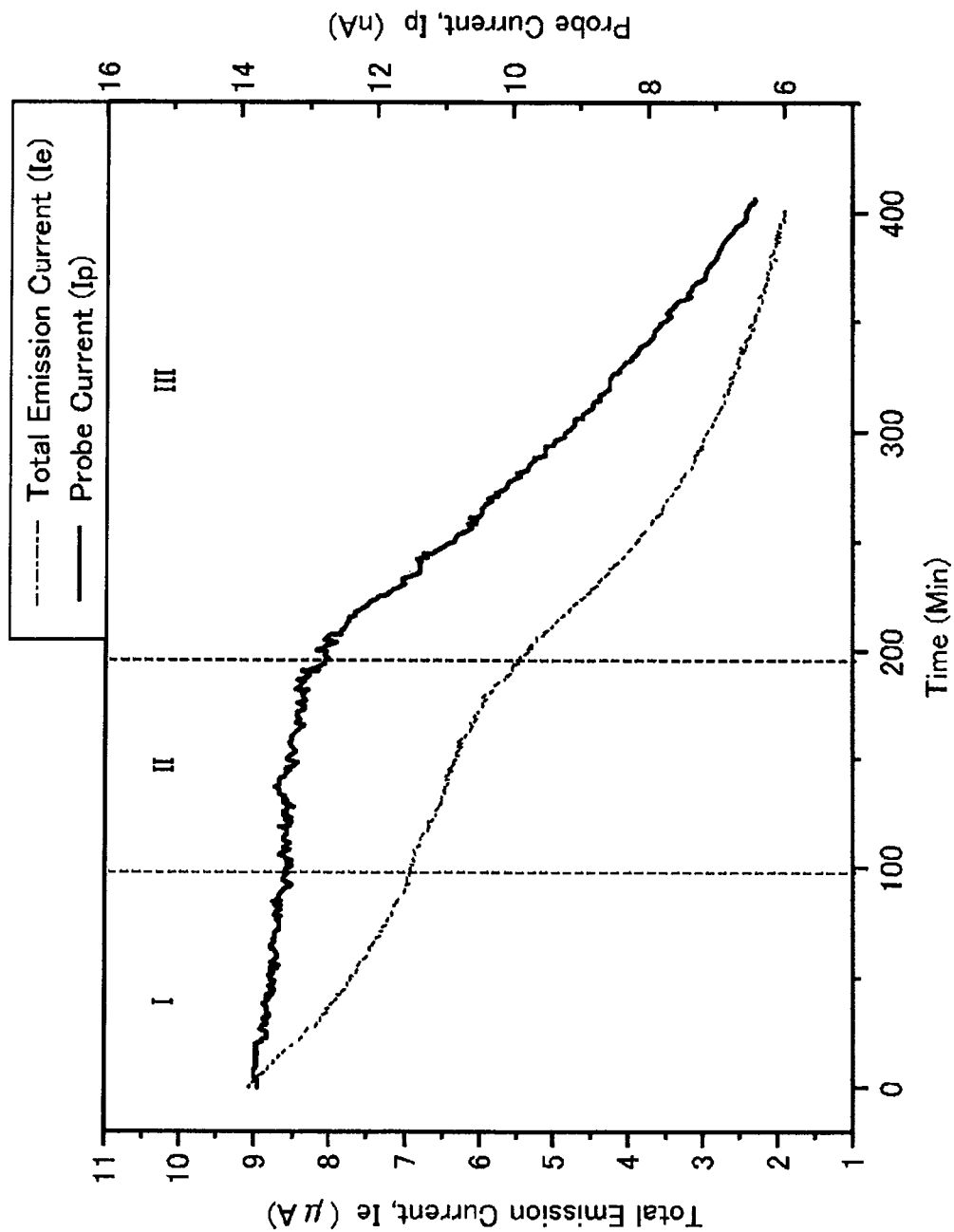
FIG. 4 is a diagram showing experiment results for explaining problems to be solved by the present invention.

If flashing cleaning is conducted in the case of the W<310> field-emission electron source, then decrease of the emission current obtained immediately after the flashing becomes as shown in FIG. 4. Although both Ie and Ip decrease as represented by emission current decrease curves in FIG. 4, Ie and Ip draw different decrease curves as functions of time.

The current Ip decreases very slowly until approximately 90% of the initial current is reached. Thereafter, the decrease becomes fast and the current falls abruptly. This area of falling is designated as decrease area III.

On the other hand, as for Ie, the decrease speed changes in the order of rapid (area I), moderate (area II) and rapid (area III) as shown in FIG. 4. If thereafter the surface of the electron source is covered completely by gas, then the Ie current becomes one several-tens-th of the initial value, but the current change stops and the current becomes stable. By the way, in the ordinary electron microscope or the like, this stable area is used although the current is one several-tens-th of the value obtained immediately after the flashing.

Different ways of decrease of Ie and Ip are considered to be caused by the fact that the change of the work function of the tungsten surface due to hydrogen adsorption differs from plane to plane. Since the work function of the (111) plane increases from the initial value due to hydrogen adsorption, the emission current from the (111) plane continues to decrease as far as several % of the initial value. On the other hand, the work function of the (310) plane does not increase in the initial hydrogen adsorption. Denoting time when the emission current decreases to 90% of the initial value by $\tau_{90}$, rapid decrease of the emission current from the (310) plane begins after the time $\tau_{90}$ in average (Ip curve in FIG. 4). Main components of Ie are emission currents $I_{(111)}$ and $I_{(310)}$ respectively from the (111) plane and the (310) plane. Furthermore, in the present experiment, the main component of Ip is the emission current $I_{(310)}$.

Figure 5:
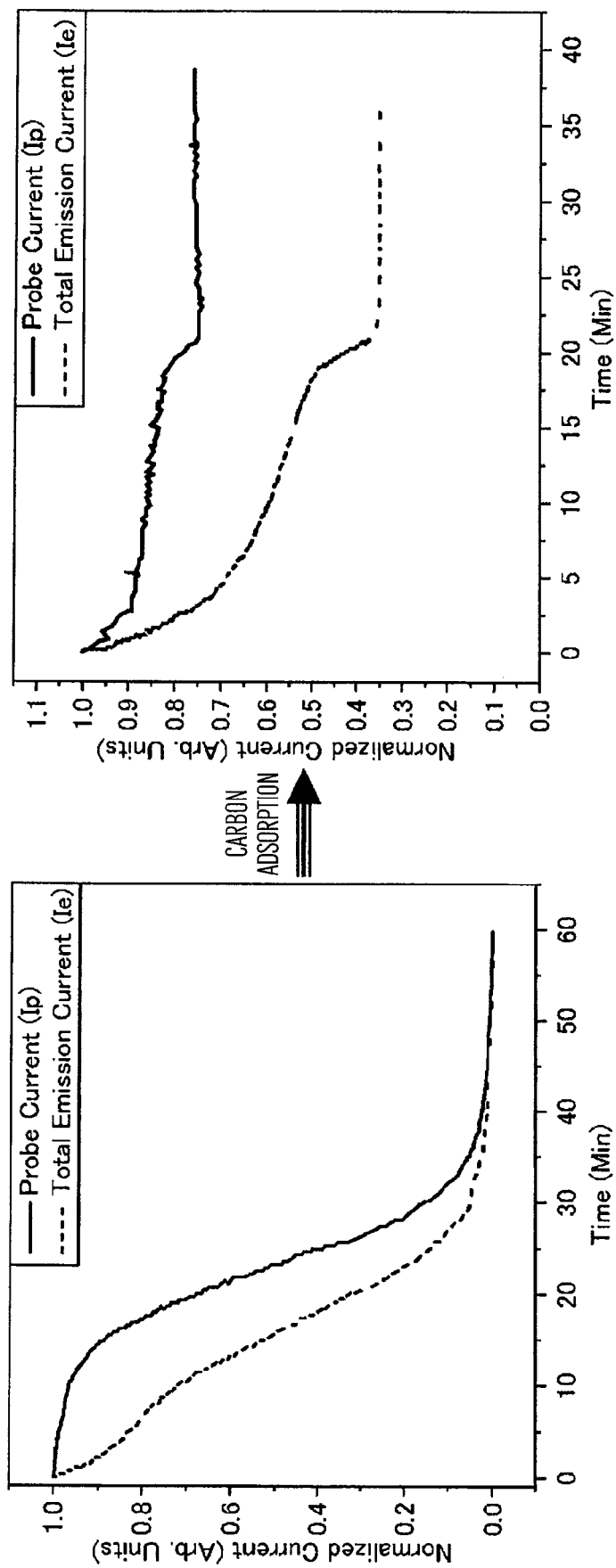
FIG. 5 is a diagram showing experiment results for explaining problems to be solved by the present invention.

Therefore, it is appreciated that the fast initial decrease (area I) of Ie reflects the fast initial decrease of $I_{(111)}$. On the other hand, the reason why the decrease of Ie becomes fast in the last stage of decrease (area III) is that Ie and Ip decrease rapidly at the same time, i.e., the decrease speed of $I_{(310)}$ increases abruptly. This is indicated by the following ground. If only the (310) plane which is the apex plane of the W<310> field-emission electron source is caused to adsorb carbon to prevent Ip from decreasing, Ie does not decrease in the area III which reflects the decrease of the emission current from the (310) plane as shown in FIG. 5.

It is appreciated from the above-described experimental results that the W<310> field-emission electron source has a feature that the probe current Ip does not decrease in the areas I and II.

Relations between the degree of vacuum of the electron gun and the emission current will now be described.

Figure 6:
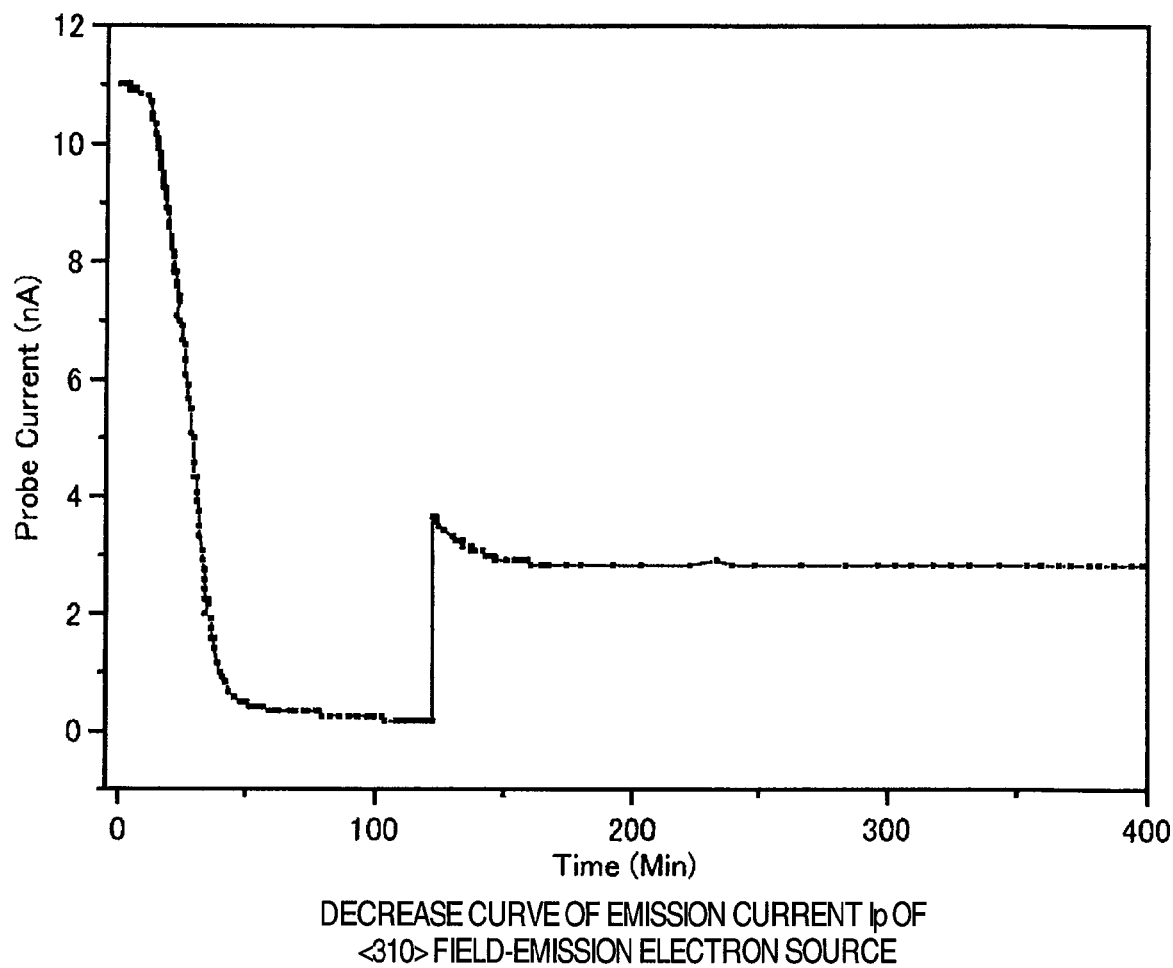
FIG. 6 is a diagram showing experiment results for explaining problems to be solved by the present invention.

In the conventional electron gun having a pressure of the level of $10^{-8}$ Pa, the emission current decreases completely as shown in FIG. 6, then the extraction voltage is raised and the total emission current Ie is restored to its initial value (usually about 10 μA), and thereafter stable observation of an electron microscope image is started.

Even if Ie is increased to its initial value, however, the probe current Ip increases only to a current which is a half or less of the initial value before the decrease. This means that the brightness of the electron beam from the tip apex (310) plane used for image observation falls to a half or less after the decrease. Emission angle current density (probe current per unit solid angle) I' data measured while changing the total emission current Ie also shows that I' becomes half or less after the decrease as compared with that before decrease. If high brightness is needed when observing an image by using an electron microscope mounting the conventional field-emission electron source of the $10^{-8}$ Pa level, observation is conducted for approximately 15 minutes before Ip from the (310) plane decreases ($\tau_{90}$).

Figure 7:
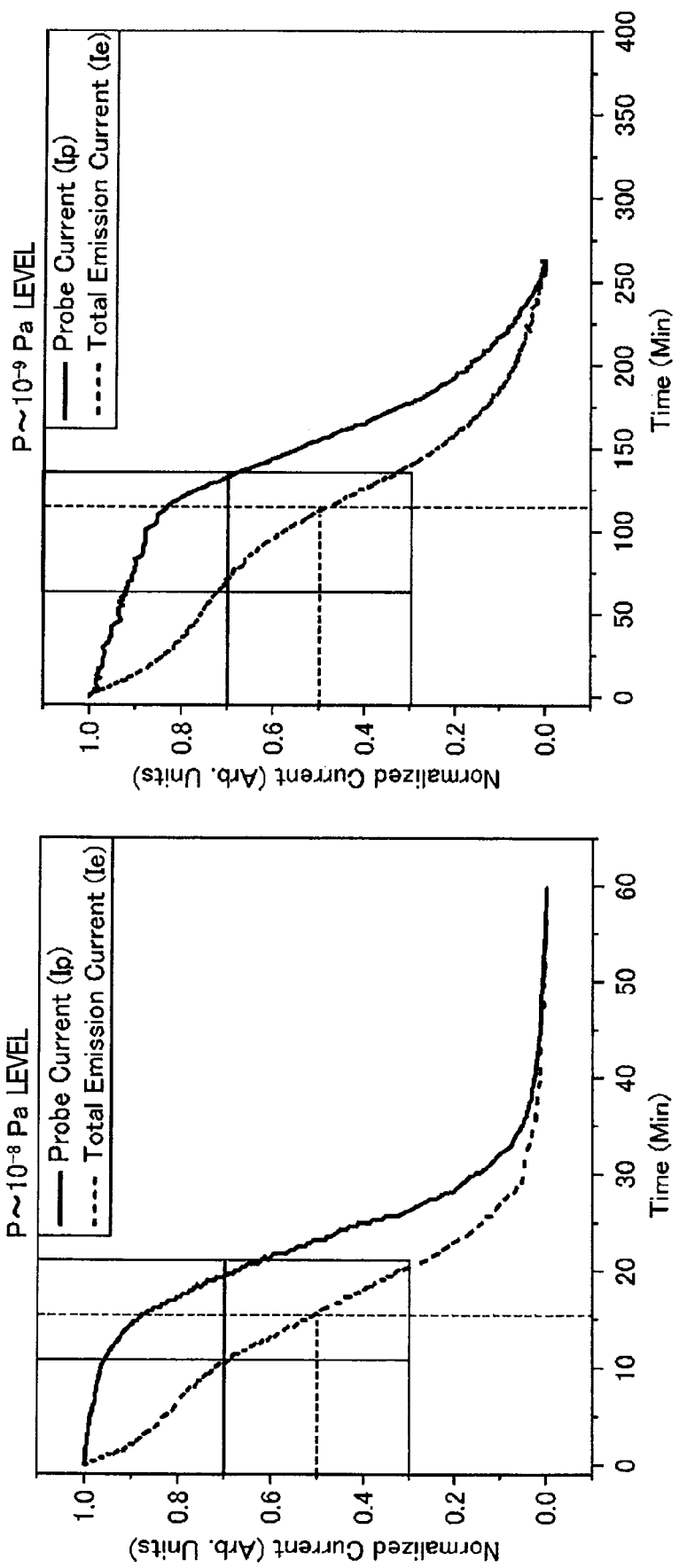
FIG. 7 is a diagram for explaining an emission current control method using the present invention.

On the other hand, it has been found that $\tau_{90}$ increases to a little less than ten times and the stable image observation time before the decrease lengthens to several hours as shown in FIG. 7 if the vacuum of the electron gun reaches to a pressure of the $10^{-9}$ Pa level. If flashing is conducted in accordance with time when rapid decrease begins, a high brightness image can be observed immediately without waiting during the decrease time period unlike the conventional electron gun.

If flashing is conducted in accordance with the time when rapid decrease begins by using these kinds of knowledge, it becomes possible to observe for a long time with a very large emission current (high brightness). In addition, if the pressure is increased to the $10^{-9}$ Pa level, the flashing interval becomes long and an electron microscope which is excellent in the practical use as well is obtained.

Embodiment 1

As for the timing of the flashing, an ammeter for measuring the actual Ip is provided, timing ($\tau_{90}$) when Ip has reached 90% of the initial value which is time when Ip decreases rapidly is monitored, and a controlling unit controls flashing at that time point.

On the other hand, in the case where gas molecules other than hydrogen remain on the surface of the electron source, or in the case where a peripheral electrode such as the anode is contaminated, it is more desirable to use a different scheme in some cases.

Figure 8:
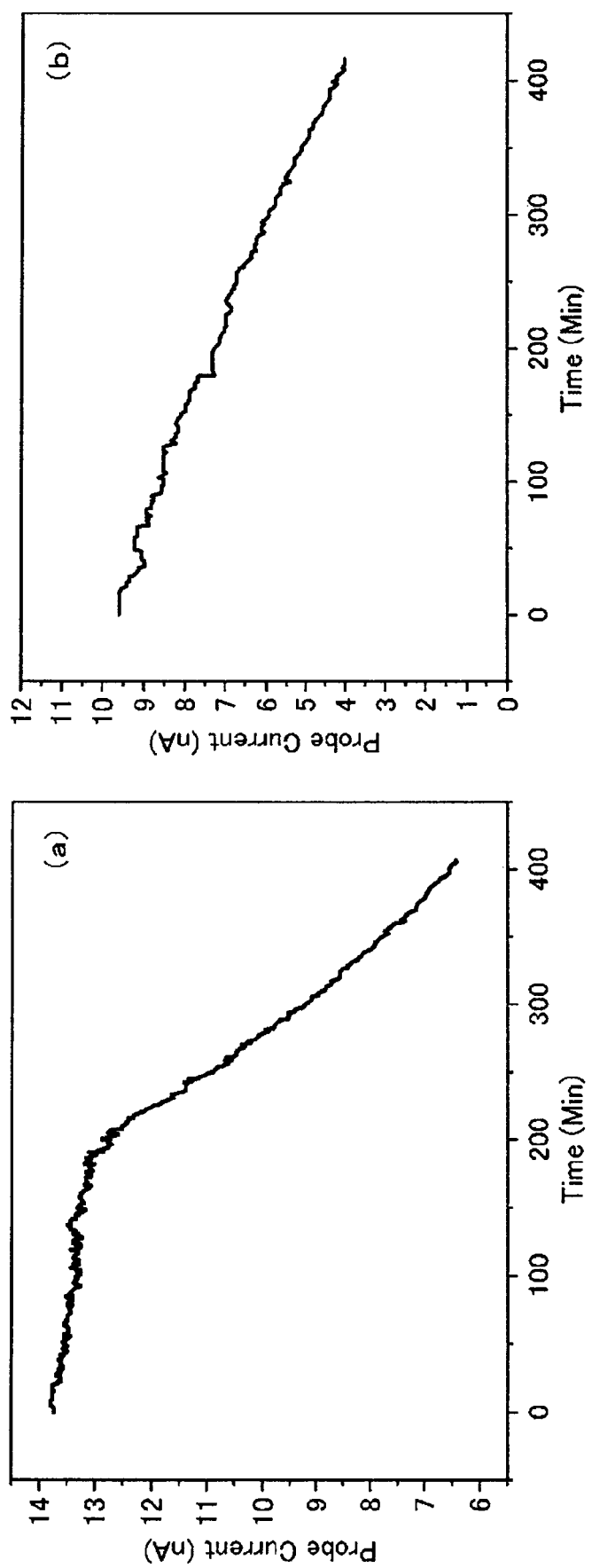
FIG. 8 is a diagram showing experiment results for explaining problems to be solved by the present invention.

In the case where the W<310> field-emission electron source is used as the electron source of an electron microscope, a high brightness image observation can always be conducted by conducting the flashing in accordance with $\tau_f$, where $\tau_f$ is time when rapid decrease of the probe current Ip begins (in FIG. 4, which is a boundary between stable areas (the areas I and II) and an decrease area (the area III)). Usually, $\tau_f$ is close to $\tau_{90}$. Depending upon the surface state of the electron source, however, rapid decrease begins at time different from $\tau_{90}$ as shown in FIG. 8.

FIG. 8(a) shows an decrease curve in the case where the surface of the electron source is clean, and rapid decrease begins in the vicinity of $\tau_{90}$. On the other hand, in the case where gas molecules other than hydrogen remain on the surface of the electron source, or in the case where a peripheral electrode such as the anode is contaminated, initial decrease of the emission current becomes relatively earlier as shown in FIG. 8(b) and rapid decrease begins after $\tau_{90}$. This is because the probe current Ip is emitted from a narrow nano-area of the (310) plane located at the apex of the electron source and consequently the probe current Ip becomes sensitive to the surface state of the electron source.

Since the contamination of the electron source surface and peripheral parts is possible, a method different from a method of monitoring Ip and looking for $\tau_{90}$ also becomes necessary. Hereafter, the method will be described.

Since the total emission current Ie is emitted from the whole surface of the electron source, noise is small as compared with the probe current Ip which gets out from a part of the apex of the electron source and deviations in the initial surface clean condition and the decrease curve caused by gas emission of peripheral parts are also small. By comparing decrease curves of Ie and Ip with each other, it has been found that time $\tau_f$ when rapid decrease of Ip begins and 50% decrease time $\tau_{e50}$ of Ie nearly coincide with each other regardless of the pressure as shown in FIG. 7. For observing an electronic microscope image in the areas I and II preceding the rapid decrease of Ip, a method of monitoring the total emission current Ie, conducting the flashing in the vicinity of $\tau_{e50}$, and controlling the probe current Ip is effective in acquiring more accurate timing of the flashing accurately. According to the present invention, in an ultra-high vacuum electron gun mounting the W<310> single crystal field-emission electron source, the time $\tau_f$ when the probe current Ip emitted from the (310) plane enters the decrease area via the high-brightness areas I and II obtained immediately after the flashing is grasped by monitoring the total emission current Ie. The flashing for cleaning the surface of the electron source is executed in accordance with the time $\tau_f$ when the probe current decreases rapidly, and an image of the electron microscope is observed in the areas I and II where the electron beam emitted from the (310) plane maintains high brightness.

Embodiment 2

Pressure around the electron source will now be described.

For prolonging the high brightness observation time by at least several hours, degasing by heating components in a vacuum furnace having a pressure of the $10^{-3}$ Pa level or less and 400° C. or above and electrolytic polishing are executed, a W<310> single crystal field-emission electron source is mounted on an electron gun with a gas emission amount reduced in this way, and the pressure around the electron source is kept at the $10^{-9}$ Pa level or less by using an exhausting system capable of lowering the pressure to the $10^{-9}$ Pa level or less.

Embodiment 3

Hereafter, a concrete form for implementing the present invention described above will be described in detail with reference to the drawings.

Figure 1:
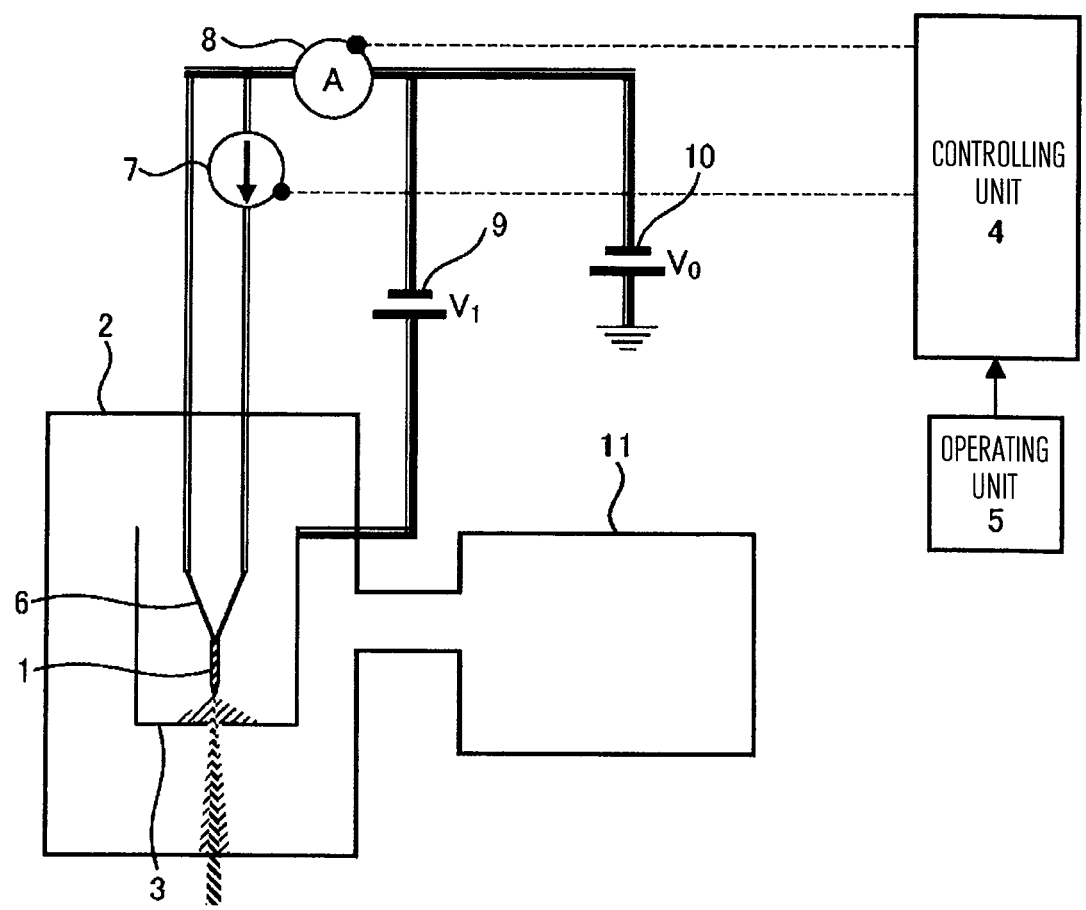
FIG. 1 is a diagram for explaining a configuration according to an embodiment of the present invention.
Figure 2:
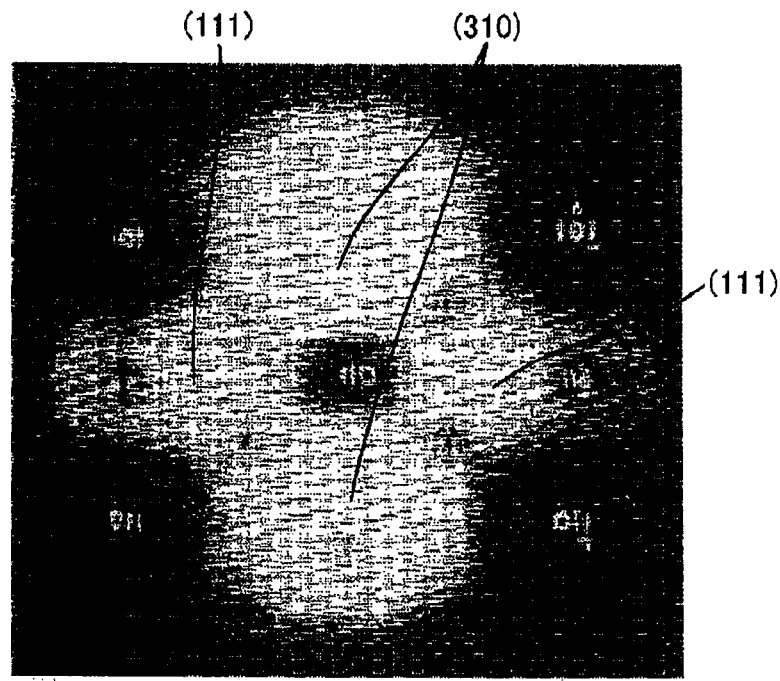
FIG. 2 shows a field electron emission pattern of a W tip.

FIG. 1 is a schematic diagram showing a configuration of an ultra-high vacuum electron gun and its control system according to an embodiment of the present invention. In the present embodiment, the ultra-high vacuum electron gun includes a W<310> field-emission electron source 1 using a (310) oriented single crystal W tip and a vacuum chamber 2 of ultra-high vacuum. The pressure in an electron gun chamber in the vacuum chamber 2 of ultra-high vacuum is kept at ultra-high vacuum of the $10^{-9}$ Pa level or less. By the way, the present embodiment uses the aspect of the invention in the embodiment 1 and the aspect of the invention in the embodiment 2 jointly. However, it is also possible to use either one of the aspects of the inventions.

In FIG. 1, the ultra-high vacuum electron gun includes a vacuum chamber 2 of ultra-high vacuum having a W<310> field-emission electron source 1 fabricated by etching W<310> single crystal wire disposed therein as an electron source, an exhausting system 11 for exhausting the ultra-high vacuum chamber 2 of ultra-high vacuum, a tungsten filament 6 for heating the W<310> field-emission electron source 1 by a current let flow through it and thereby conducting flashing, a flashing power supply 7 capable of letting a current flow through the filament 6, an ammeter 8 for measuring a total emission current Ie emitted from the W<310> field-emission electron source 1, an electron source controlling unit 4 for judging a suitable flashing time of the W<310> field-emission electron source 1 on the basis of a measured value of Ie sent from the ammeter 8 and causing the flashing power supply 7 to let a current flow through the filament 6 to clean the W<310> field-emission electron source 1, and an operating unit 5 for inputting parameters, which specifies flashing timing, time, flashing current, and the like, to the electron source controlling unit 4.

The flashing is conducted by letting a current flow through the filament 6 for a determinate time and raising the temperature of the W<310> field-emission electron source 1 to, for example, 1500 K or above as a result of heating. The time period for which the current is let flow is approximately several seconds at its maximum, and the current is let flow a plurality of times depending upon the surface state. If flashing is conducted in accordance with the time $\tau_f$ when rapid decrease of Ip begins as shown in FIG. 4, an electron microscope image can be observed in the high brightness stable areas I and II more effectively.

The timing of the flashing is determined according to the procedure described hereafter. The flashing power supply 7 is controlled to conduct flashing in accordance with the parameters such as the current, voltage, power, and time which are input by using the operating unit 5. If the surface of the W<310> field-emission electron source 1 becomes clean owing to the flashing, then the electron source controlling unit 4 controls an extraction power supply 9, applies a positive extraction voltage to an extraction electrode 3, and causes an electron beam having a total emission current value $I_{e0}$ determined by the operating unit 5 to be emitted from the W<310> field-emission electron source 1. Immediately thereafter, the electron source controlling unit 4 stores the current value $I_{e0}$ measured by the ammeter 8 in a memory. While the electron beam is being emitted from the W<310> field-emission electron source 1, the ammeter 8 measures the total emission current measured values Ie at intervals of several seconds and sends the measured values to the electron source controlling unit 4. The electron source controlling unit 4 compares the total emission current measured values Ie which are sent with the initial value $I_{e0}$ stored in the memory. If the total emission current measured value Ie becomes a determined ratio in the vicinity of 50% (for example, a determined value in the range of 30% to 70%) of the initial value $R \times I_{e0}$ or less, flashing is conducted to prevent the probe current from decreasing.

As for the timing of the flashing, the flashing is conducted automatically at time when the electron source controlling unit 4 has detected that the relation $Ie \leq R \times I_{e0}$ is satisfied.

However, the electron source controlling unit 4 monitors the operation state of the electron microscope, and exercises control to prevent the flashing from being conducted while acquiring an electron microscope image such as a secondary electron image, a reflected electron image, an EDX mapping image, or an EELS mapping image, or spectrum of EDX, WDX, or EELS and conduct flashing a predetermined time after the image or spectrum is acquired.

In another method, the electron source control unit 4 starts monitoring of the operation state of the electron microscope when it has detected that the relation Ie≤R×$I_{e0}$ is satisfied. When an operator of the electron microscope has interrupted the electron microscope image observation, flashing is conducted automatically. For example, timing of sample interchange is detected, and flashing is conducted automatically during the sample interchange.

In another method, timing of a valve operation for intercepting an electron beam path between the W<310> field-emission electron source 1 and the sample is detected. Flashing is conducted automatically while the valve intercepts the electron beam path between the W<310> field-emission electron source 1 and the sample.

In another method, the operating situation, such as the focus adjustment, visual field movement, or magnification adjustment, of the electron microscope operator is monitored. If the electron microscope operating is not conducted for some determinate time, flashing is conducted automatically.

In the case where the electron source controlling unit 4 starts monitoring of the operation state of the electron microscope when it has detected that the relation Ie≤R×$I_{e0}$ is satisfied and the electron microscope operator does not interrupt the electron microscope image observation, however, the electron source controlling unit 4 may exercise control to cause flashing to be conducted automatically. Or, for example, R' satisfying the relation R'<R may be predetermined and the electron source controlling unit 4 may exercise control to cause flashing to be conducted automatically at time when a relation Ie≤R'×$I_{e0}$ is satisfied.

The electron source controlling unit 4 may execute an instruction for displaying a message to urge to conduct flashing on an observation monitor of the operator at time when the relation Ie≤R×$I_{e0}$ is satisfied. The operator executes flashing manually by pressing a flashing start button disposed on the operating unit.

Figure 9:
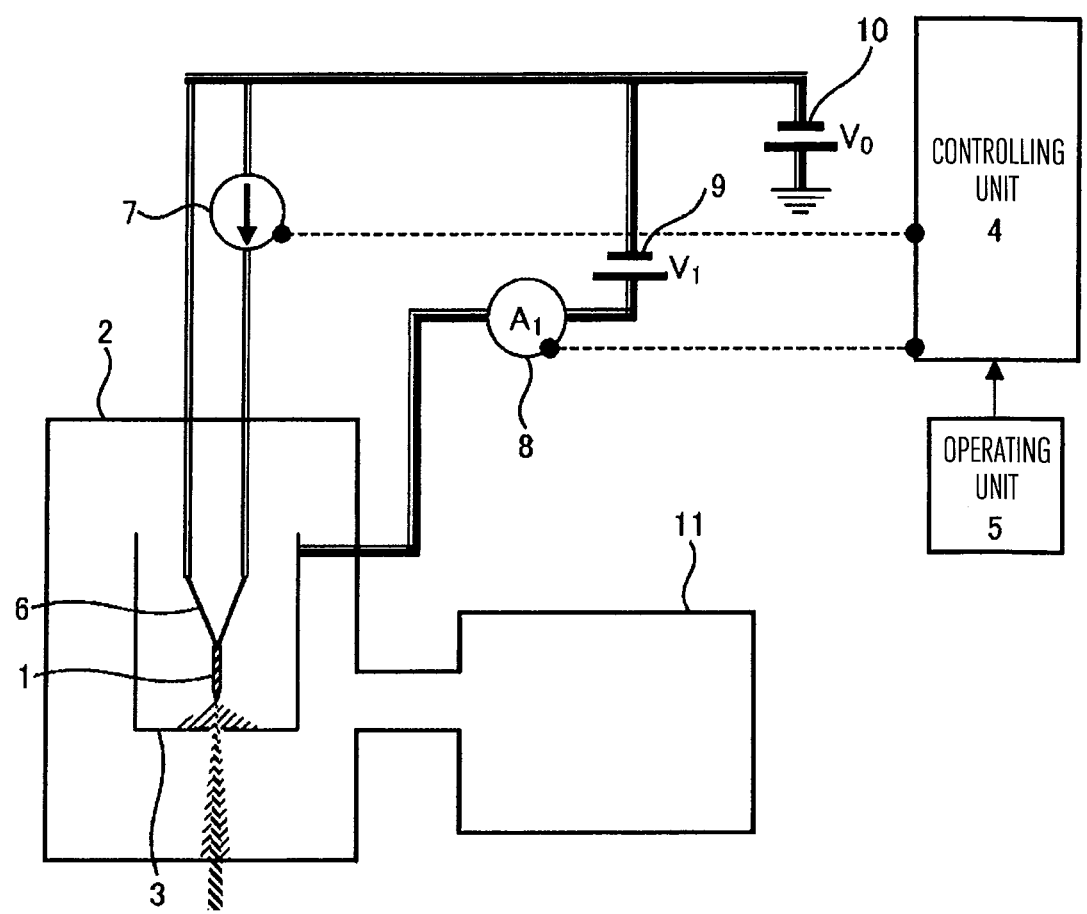
FIG. 9 is a diagram for explaining a configuration in an embodiment of an emission current control method according to the present invention.

A measurement method of the total emission current value Ie using a micro-ammeter will now be described. In the case where an acceleration voltage $V_0$ is low and a leak current from a high voltage side including the W<310> field-emission electron source 1, the filament 6, the extraction electrode 3, and an acceleration power supply 10 is slight, the micro-ammeter may be disposed in series with either of an interconnection on the W<310> field-emission electron source 1 side and an interconnection on the extraction electrode 3 side as shown in FIG. 1 and FIG. 9 to measure the current value.

Figure 10:
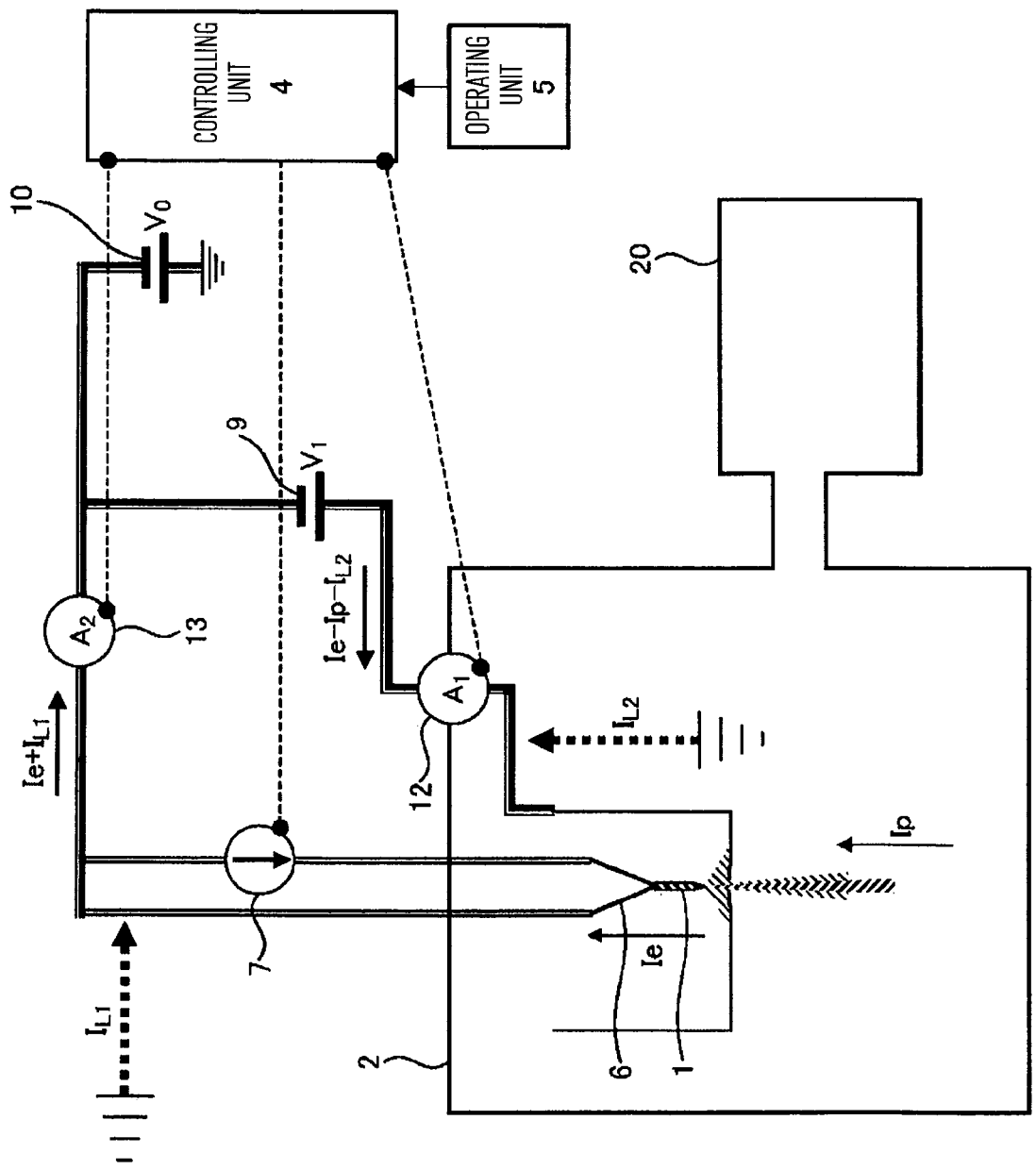
FIG. 10 is a diagram for explaining a configuration in an embodiment of an emission current control method according to the present invention.
Figure 11:
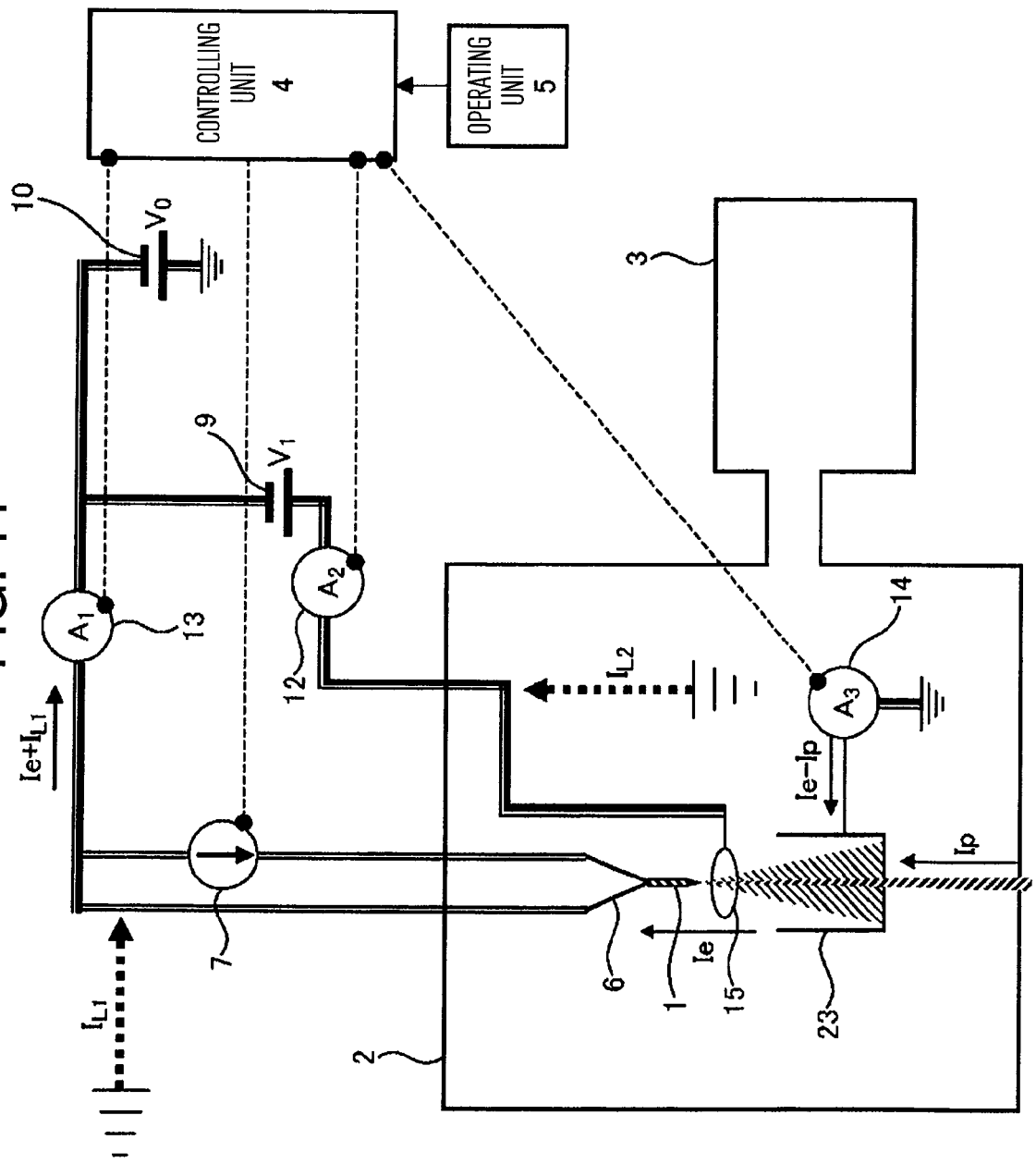
FIG. 11 is a diagram for explaining a configuration in an embodiment of an emission current control method according to the present invention.

On the other hand, in the case where a high negative acceleration voltage $V_0$ is applied, a leak current occurs on the high voltage side in some cases as shown in FIG. 10 and FIG. 11.

As shown in FIG. 10, the voltage applied to the W<310> field-emission electron source 1 maintains a determinate value $V_0$. If a positive extraction voltage is applied to the extraction electrode, a current which flows through an ammeter $A_2$ 13 disposed between the extraction power supply 9 and the W<310> field-emission electron source 1 increases from a leak current $I_{L1}$ to Ie+$I_{L1}$. If a difference in current between before and after the application of the extraction voltage is taken, therefore, the difference is equivalent to the emission current from the W<310> field-emission electron source 1.

If a superfine-pointed extraction electrode 15 fabricated by using a thin wire or the like to be hardly struck by the electron beam is adopted and a Faraday cup 23 is provided on a ground side struck by the electron beam as shown in FIG. 11, a leak current does not occur because the Faraday cup 23 is near 0 in voltage. A current value which can be measured by an ammeter $A_3$ 14 between the Faraday cup 23 and the ground becomes a value (Ie−Ip) obtained by subtracting a current Ip which passes through a diaphragm of the Faraday cup 23. Since Ip is small as compared with Ie, the current value which can be measured by the ammeter $A_3$ 14 may be used as Ie.

For using the electron gun mounting the W<310> field-emission electron source 1 during a time period between immediately after the flashing and before the decrease (the areas I and II in FIG. 4) over which the probe current Ip emitted from the electron source apex (310) plane has high stable brightness, it is necessary to prolong the time period of the areas I and II. If the pressure in the vacuum chamber 2 of ultra-high vacuum having the W<310> field-emission electron source 1 disposed therein is kept at the level of $10^{-9}$ Pa or less, the time period of the areas I and II becomes at least 30 minutes. In the present invention, the pressure around the electron gun mounting the W<310> field-emission electron source 1 is brought to the level of $10^{-9}$ Pa or less by constructing the vacuum system of the electron gun mounting the W<310> field-emission electron source 1 as described below.

All parts and a vacuum vessel in the vacuum chamber 2 of ultra-high vacuum having the W<310> field-emission electron source 1 disposed therein are fabricated by using materials which can be heated to at least 300° C. and degassed in a vacuum furnace which maintains a pressure of the $10^{-3}$ Pa level or less, for at least one hour. If metal parts are subject to electrolytic polishing before degassing, the gas emission amount is further decreased. However, it is not indispensable.

Figure 12:
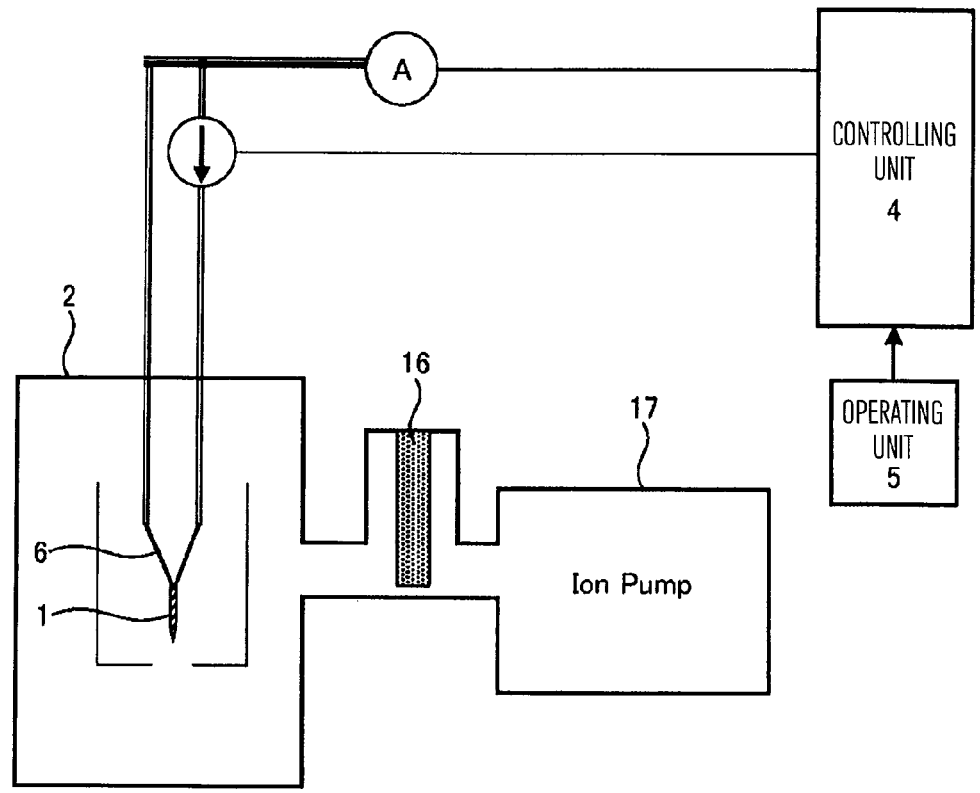
FIG. 12 is a diagram for explaining an example of an arrangement structure of a non-evaporable getter pump and an ion pump used in the present invention.

As an exhausting system of the vacuum chamber 2 of ultra-high vacuum having the W<310> field-emission electron source 1 disposed therein, a non-evaporable getter pump 16 and an ion pump 17 having an exhausting speed of at least 1 l/s are used jointly as shown in FIG. 12.

Figure 13:
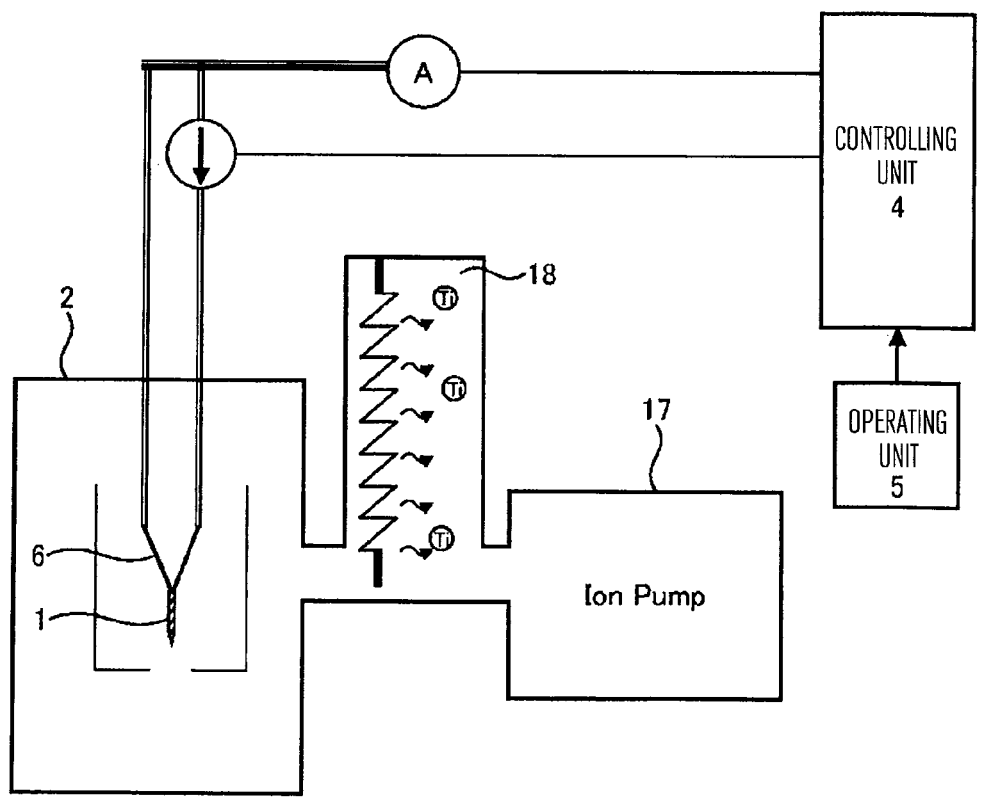
FIG. 13 is a diagram for explaining an example of an arrangement structure of a titanium sublimation pump and an ion pump used in the present invention.

In another method, a titanium sublimation pump 18 and an ion pump 17 are used jointly as an exhausting system of the vacuum chamber 2 of ultra-high vacuum having the W<310> field-emission electron source 1 disposed therein as shown in FIG. 13.

Figure 14:
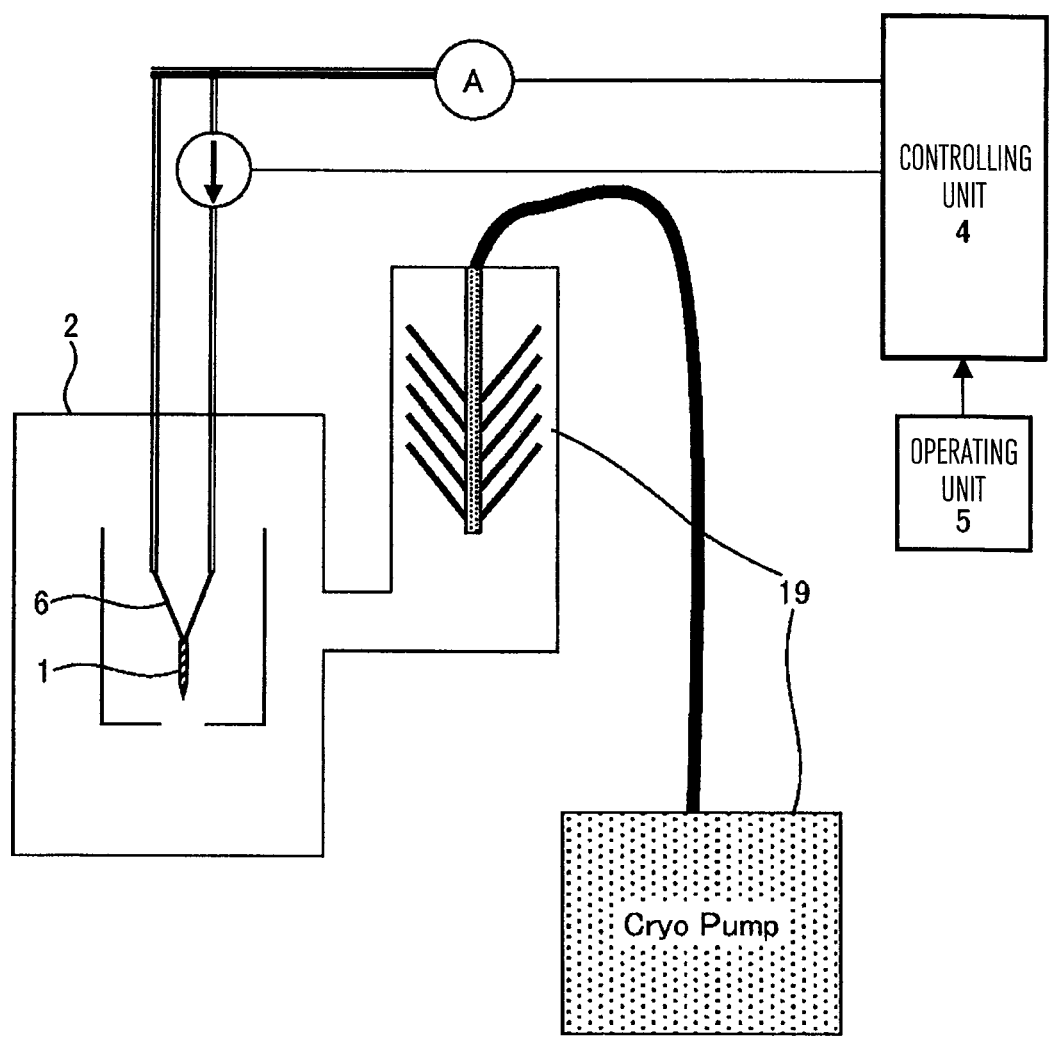
FIG. 14 is a diagram for explaining an example of an arrangement structure of a cryo pump used in the present invention.

In another method, a cryo pump 19 is used as an exhausting system of the vacuum chamber 2 of ultra-high vacuum having the W<310> field-emission electron source 1 disposed therein as shown in FIG. 14.

Figure 15:
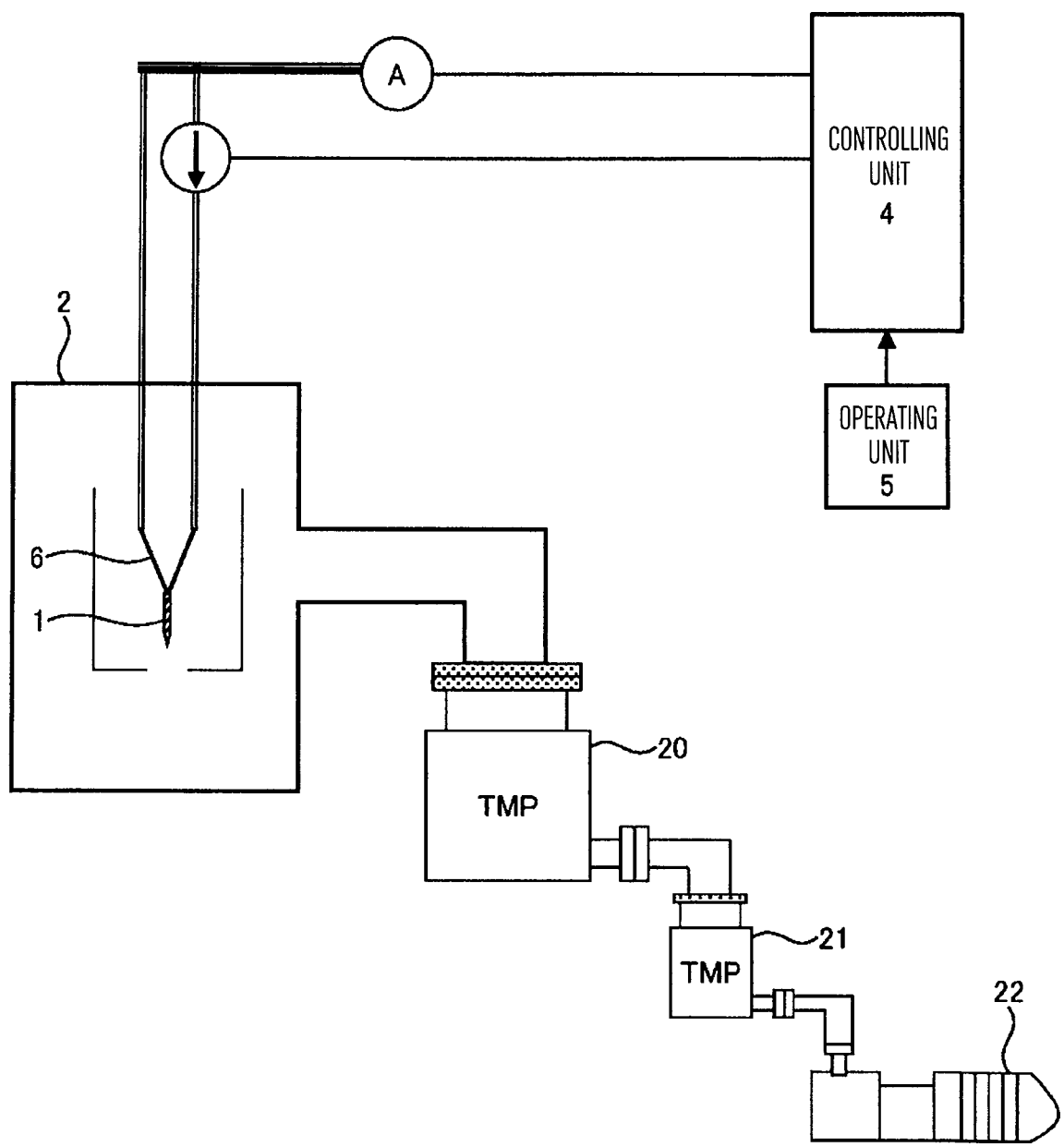
FIG. 15 is a diagram for explaining an example of an arrangement structure of a tandem turbomolecular pump evacuation system.

In still another method, as an exhausting system of the vacuum chamber 2 of ultra-high vacuum having the W<310> field-emission electron source 1 disposed therein, the vacuum chamber 2 of ultra-high vacuum is exhausted by a first stage turbomolecular pump 20 having an exhausting speed of at least 100 l/s as shown in FIG. 15. A second turbomolecular pump 21 is attached to an exhaust port of the first stage turbomolecular pump 20 to conduct exhaustion. An auxiliary pump 22 is attached to an exhaust port of the second stage turbomolecular pump 21 to conduct exhaustion.

If the pressure around the W<310> field-emission electron source 1 is brought to the $10^{-9}$ Pa level or less by using a technique as described above, it is possible to prolong the time in the areas I and II and the original high brightness of the W<310> field-emission electron source can be utilized effectively.

REFERENCE SIGNS LIST

1: W<310> field-emission electron source, 2: vacuum chamber, 3: extraction electrode, 4: electron source controlling unit, 5: operating unit, 6: filament, 7: flashing power supply, 8: ammeter, 9: extraction power supply, 10: acceleration power supply, 11: exhausting system, 12: ammeter $A_1$, 13: ammeter $A_2$, 14: ammeter $A_3$, 15: superfine-pointed extraction electrode, 16: non-evaporable getter pump (NEG), 17: ion pump, 18: titanium sublimation pump, 19: cryo pump, 20: first stage turbomolecular pump, 21: second stage turbomolecular pump, 22: auxiliary pump, 23: Faraday cup.

The invention claimed is:

1. A charged particle beam apparatus comprising:
    a field-emission electron source comprising <310> single crystal of tungsten;
    a vacuum chamber having the electron source disposed therein;
    an exhausting system for exhausting the vacuum chamber;
    a filament connected to the electron source to let flow a current through the electron source and thereby heat the electron source;
    a power supply for letting a current flow through the filament;
    an ammeter for measuring a total current emitted from the electron source; and
    a controlling unit for exercising control to cause the power supply to let a current flow through the filament when the total current measured periodically has become a predetermined ratio of 30% - 70% or less as compared with a total current from the electron source found immediately after first electron beam emission, or a total current from the electron beam found immediately after a current is let flow through the filament.

2. The charged particle beam apparatus according to claim 1, wherein the controlling unit exercises control to cause the power supply to let flow a current through the filament when the total current has become half as compared with a total current obtained immediately after electron beam emission or a total current obtained immediately after a current is let flow through the filament.

3. The charged particle beam apparatus according to claim 1, comprising an operating unit for inputting time to let flow a current through the filament, a time period to let flow a current, and a current to the controlling unit.

4. The charged particle beam apparatus according to claim 1, wherein the exhausting system keeps a pressure in the vacuum chamber at a $10^{-9}$ Pa level or less.

5. The charged particle beam apparatus according to claim 4, wherein parts in the vacuum chamber and the vacuum chamber are fabricated by using materials which can be heated to at least 300° C., and are subject to processing of degassing at a temperature of at least 300° C. in a vacuum furnace which maintains a pressure of a $10^{-3}$ Pa level or less, for at least one hour.

6. The charged particle beam apparatus according to claim 4, wherein a non-evaporable getter pump and an ion pump having an exhausting speed of at least 1 l/s are used jointly as the exhausting system.

7. The charged particle beam apparatus according to claim 4, wherein a titanium sublimation pump and an ion pump are used jointly as the exhausting system.

8. The charged particle beam apparatus according to claim 4, wherein a cryo pump is used as the exhausting system.

9. The charged particle beam apparatus according to claim 4, wherein the exhausting system comprises:
    a first stage turbomolecular pump having an exhausting speed of at least 100 l/s;
    a second stage turbomolecular pump disposed at an exhausting port of the first stage turbomolecular pump; and
    an auxiliary pump disposed at an exhausting port of the second stage turbomolecular pump.

10. The charged particle beam apparatus according to claim 1, wherein a current is let flow through the filament once or a plurality of times for a determinate time period, and the electron source is raised in temperature to at least 1500K by heating resulting from current flowing.

11. The charged particle beam apparatus according to claim 1, wherein the controlling unit suspends the control for letting flow a current through the filament, while a signal emitted from a sample is being detected.

12. The charged particle beam apparatus according to claim 1, wherein the controlling unit suspends the control for letting flow a current through the filament, while the charged particle beam apparatus is being operated.

13. The charged particle beam apparatus according to claim 1, wherein
    the charged particle beam apparatus comprises a monitor, and
    the controlling unit displays a message on the monitor to urge to let a current flow through the filament when the total current has become a predetermined ratio or less as compared with a total current from the electron source found immediately after electron beam emission or a total current from the electron beam found immediately after a current is let flow through the filament.

14. The charged particle beam apparatus according to claim 1, wherein
    an extraction electrode which ejects the electron beam from the electrode source is made of a thin metal wire,
    a Faraday cup is provided on a ground side struck by said electron beam, and
    an ammeter is disposed between the Faraday cup and the ground.

* * * * *